(12) United States Patent
Johnson et al.

(10) Patent No.: US 12,422,510 B2
(45) Date of Patent: Sep. 23, 2025

(54) CONTROLLING GRADIENT NOISE IN MAGNETIC RESONANCE IMAGING

(71) Applicant: KONINKLIJKE PHILIPS N.V., Eindhoven (NL)

(72) Inventors: Mark Thomas Johnson, Arendonk (BE); Steffen Weiss, Hamburg (DE); Marieke Van Dooren, Arendonk (BE); Jan Hendrik Wuelbern, Hamburg (DE); Christoph Günther Leussler, Hamburg (DE); Rajendra Singh Sisodia, Bangalore (IN)

(73) Assignee: Koninklijke Philips N.V., Eindhoven (NL)

( * ) Notice: Subject to any disclaimer, the term of this patent is extended or adjusted under 35 U.S.C. 154(b) by 188 days.

(21) Appl. No.: 18/273,060

(22) PCT Filed: Jan. 18, 2022

(86) PCT No.: PCT/EP2022/050945
§ 371 (c)(1),
(2) Date: Jul. 19, 2023

(87) PCT Pub. No.: WO2022/157130
PCT Pub. Date: Jul. 28, 2022

(65) Prior Publication Data
US 2024/0094319 A1    Mar. 21, 2024

(30) Foreign Application Priority Data
Jan. 21, 2021    (EP) ..................................... 21152756

(51) Int. Cl.
*G01R 33/38*    (2006.01)
*G01R 33/385*    (2006.01)
*G01R 33/54*    (2006.01)

(52) U.S. Cl.
CPC ....... *G01R 33/3854* (2013.01); *G01R 33/543* (2013.01)

(58) Field of Classification Search
CPC .............. G01R 33/3854; G01R 33/543; G01R 33/3852
See application file for complete search history.

(56) References Cited

U.S. PATENT DOCUMENTS

| | | | |
|---|---|---|---|
| 9,694,155 B2 | 7/2017 | Panova et al. | |
| 2011/0142250 A1* | 6/2011 | Schmale | H04K 3/825 |
| | | | 381/73.1 |
| 2019/0321583 A1 | 10/2019 | Poltorak | |

FOREIGN PATENT DOCUMENTS

| | | |
|---|---|---|
| CN | 104667407 A | 6/2015 |
| JP | 2011161033 A | 8/2011 |

OTHER PUBLICATIONS

Dang-Vu Thien Thanh et al "Interplay Between Spontaneous and Induced Brain Activity During Human Non-Rapid Eye Movement Sleep" Proceedings of the National Academy of Sciences, vol. 108, No. 37 Sep. 13, 2011 p. 15438-15443.

(Continued)

*Primary Examiner* — G.M. A Hyder

(57) ABSTRACT

There is provided a method of determining a scan sequence for magnetic resonance imaging—MRI. The method comprises: receiving an indication of one or more selected imaging parameters for the MRI; and based on the selected imaging parameters, determining the scan sequence usable by an MRI apparatus to perform the MRI, wherein determining the scan sequence comprises configuring the scan sequence to modulate gradient noise arising from the MRI apparatus during the MRI to deliver a first audible signal to the patient, wherein the first audible signal is configured to perform auditory stimulation of slow wave activity in the patient.

15 Claims, 3 Drawing Sheets

(56) References Cited

OTHER PUBLICATIONS

Garcia-Molina Gary et al: "Hybrid in-phase and continuous auditory stimulation significantly enhances slow wave activity during sleep", 2019 41st Annual International Conference of the IEEE Engineering in Medicine and Biology Society (EMBC), IEEE, Jul. 23, 2019 (Jul. 23, 2019), pp. 4052-4055.

Kim Y-C et al: "Caught sleeping: recording of snoring during a real-time MRI scan", Proceedings of the International Society for Magnetic Resonance in Medicine, 21st Annual Meeting and Exhibition, Salt Lake City, Utah, USA, Apr. 20-26, 2013, vol. 21, 1235, Apr. 7, 2013.

International Search Report and Written Opinion from PCT/EP2022/050945 mailed Apr. 25, 2022.

Tononi G, et al. Enhancing sleep slow waves with natural stimuli. Medicamundi 2010:54(2);82-88.

S. Yue. Clinical study on acupuncture for primary insomnia. J. Acupunct Tuina Sci. 2017 DOI:10.1007/s11727-017-1037-4.

Mian "Pressure Points to Help You Fall Asleep" Medical News Today, Dec. 10, 2019.

Simon "Hypnosis Using a Communication Device to Increase Magnetic Resonance Imaging Tolerance" Military Medicine vol. 164 1999.

* cited by examiner

CONTROLLING GRADIENT NOISE IN MAGNETIC RESONANCE IMAGING

CROSS REFERENCE TO RELATED APPLICATIONS

This application is a U.S. national phase application of International Application No. PCT/EP2022/050945 filed on Jan. 18, 2022, which claims the benefit of EP Application Serial No. 21152756.9 filed on Jan. 21, 2021 and is incorporated herein by reference.

FIELD OF THE INVENTION

The invention relates to controlling gradient noise in magnetic resonance imaging (MRI), in particular to determining a scan sequence for magnetic resonance imaging whereby gradient noise is controlled to induce a non-waking state in the patient, and to controlling a magnetic resonance imaging apparatus using the so determined scan sequence.

BACKGROUND OF THE INVENTION

Patient motion is the most important source of image artifacts in MRI. It often leads to the missing of small lesions, obscuring of important structures, or generally bad image quality, such that many scans have to be repeated. Various approaches to address patient motion have been proposed. A first approach makes use of data provided by external sensors or the MRI data itself to detect motion and thereby to choose not to acquire or to discard the fraction of MRI data that may otherwise introduce artifacts. This approach generally increases scan time. A second approach seeks to minimize patient motion by convenient positioning, immobilization, or patient coaching. In some pediatric imaging cases, even sedation is considered as a last resort to avoid patient motion, with obvious additional effort and side effects.

SUMMARY OF THE INVENTION

There is a need for technology that effectively avoids or addresses patient motion in an autonomous setting with minimal staff intervention.

This need is met by the subject-matter of the independent claims. Optional features are provided by the dependent claims and by the following description.

According to a first aspect, there is provided a method of determining a scan sequence for magnetic resonance imaging—MRI. The method comprises: receiving an indication of one or more selected imaging parameters for the MRI; and, based on the selected imaging parameters, determining the scan sequence usable by an MRI apparatus to perform the MRI. Determining the scan sequence comprises configuring the scan sequence to modulate gradient noise arising from the MRI apparatus during the MRI to deliver a first audible signal to the patient. The first audible signal is configured to perform auditory stimulation of slow wave activity in the patient According to a second aspect, there is provided a method of controlling a magnetic resonance imaging—MRI—apparatus. The method comprises: obtaining a scan sequence determined according to the method of the first aspect; and controlling the MRI apparatus to perform an MRI scan using the obtained scan sequence.

According to a third aspect, there is provided a computing device or an MRI apparatus comprising a processor configured to perform the method of the first or second aspect.

According to a fourth aspect, there is provided a computer program product comprising instructions which, when executed by a computing device, cause or enable the computing device to carry out the method of the first or second aspect.

According to a fifth aspect, there is provided a computer-readable medium comprising instructions which, when executed by a computing device, cause or enable the computing device to carry out the method of the first or second aspect.

These and other aspects of the invention will be apparent from and elucidated with reference to the following detailed description.

BRIEF DESCRIPTION OF THE DRAWINGS

Below, examples are described in more detail with reference to the attached drawings, in which.

DETAILED DESCRIPTION OF EMBODIMENTS

Figure 1:
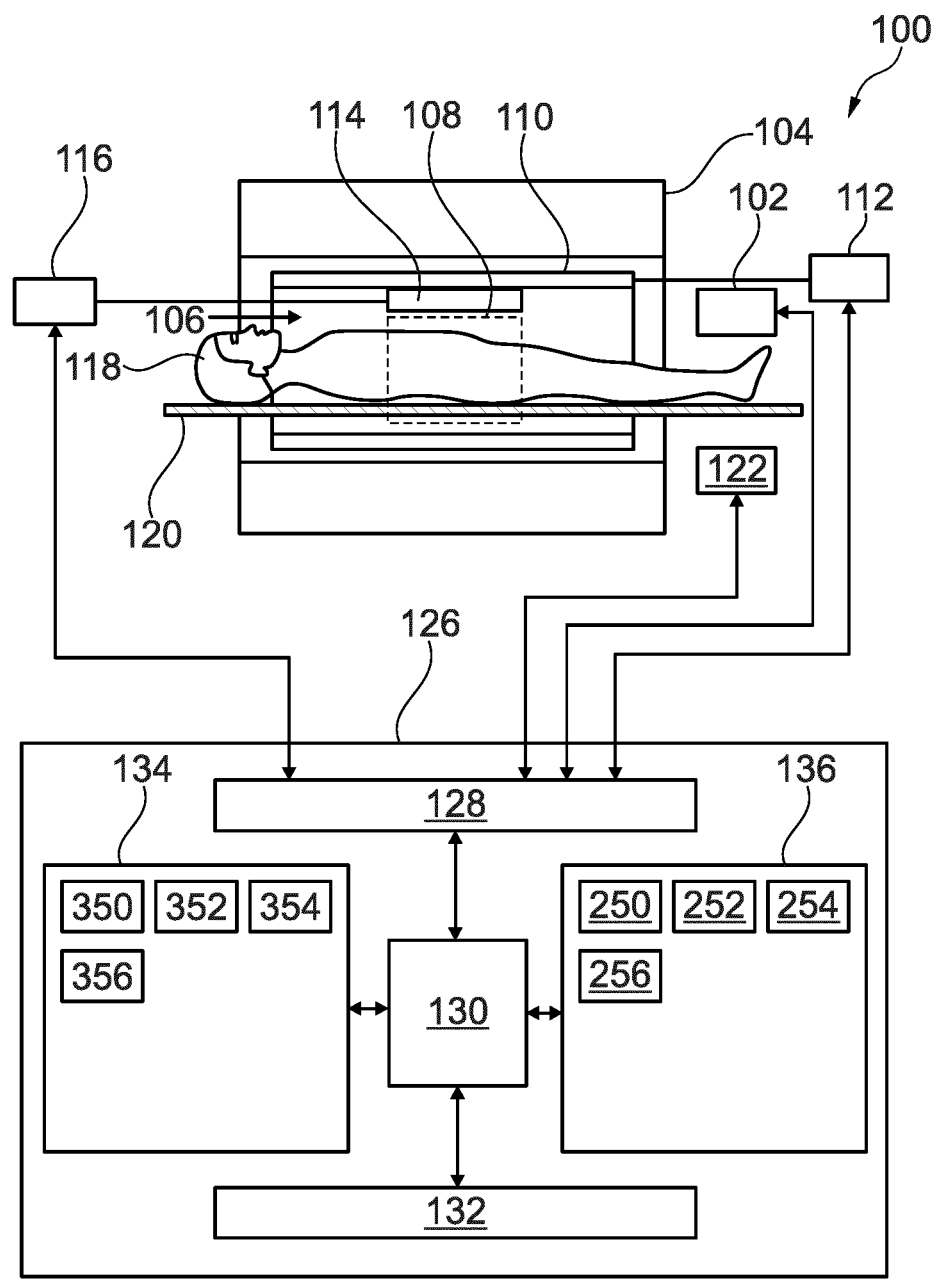
FIG. 1 illustrates a magnetic resonance imaging apparatus.

FIG. 1 illustrates an exemplary magnetic resonance imaging apparatus 100. The magnetic resonance imaging apparatus 100 comprises a magnet 104 such as a superconducting cylindrical type magnet with a bore 106 through it that is large enough to receive a subject 118 on a support 120. Within the bore 106 of the cylindrical magnet 104 there is an imaging zone 108 where the magnetic field is strong and uniform enough to perform magnetic resonance imaging. Within the bore 106 there is also a set of magnetic field gradient coils 110 used for acquisition of magnetic resonance data to spatially encode magnetic spins within the imaging zone 108. The gradient coils 110 contain three separate sets of coils for spatially encoding in three orthogonal spatial directions. The gradient coils 110 are connected to a power supply 112 which supplies current to the gradient coils 110. Adjacent to the imaging zone 108 is a radio-frequency antenna 114 for manipulating the orientations of magnetic spins within the imaging zone 108 and for receiving radio transmissions from spins also within the imaging zone 108. The radio frequency antenna 114 may contain multiple coil elements. The radio-frequency coil 114 is connected to a radio frequency transceiver 116. The radio-frequency antenna 114 and radio frequency transceiver 116 may be replaced by separate transmit and receive coils and a separate transmitter and receiver. It will be understood that the details of the magnetic resonance imaging apparatus 100 are provided herein for the purposes of illustration only and that the techniques described herein are application to any imaging system which produces modulable noise. The magnetic resonance imaging apparatus 100 comprises a control system 126 connected via a hardware interface 128 to the magnetic field gradient coil power supply 112 and to the transceiver 116. The control system 126 comprises a processor 130 connected to the hardware interface 128 along with a user interface 132, data storage 134, and memory 136.

A scan control module 250 in the memory 136 contains computer-executable code which enables the processor 130 to control the operation and function of the magnetic resonance imaging apparatus 100. In particular, the scan control module 250 is configured to obtain a scan sequence 350 determined according to the methods described herein, and to control the magnetic resonance imaging apparatus 100 to perform a magnetic resonance imaging scan using the obtained scan sequence. The scan may comprise for example a gradient echo scan, an echo-planar scan, a spin-echo scan, or a diffusion scan. The scan sequence 350, which in this example is obtained by its retrieval from the data storage 134, comprises one or more pulse sequences, which contain data which can be converted into instructions enabling the processor 130 to acquire magnetic resonance data 352 using the magnetic resonance imaging apparatus 100. The acquired magnetic resonance data 352, which is stored in the data storage 134, may be used to reconstruct one or more magnetic resonance images. For example, the memory 136 is shown further containing an image reconstruction module 252 which contains computer executable code or instructions which enable the processor 130 to reconstruct magnetic resonance images using the acquired magnetic resonance data 352. The pulse sequences may be viewed as commands configured for controlling the magnetic resonance imaging apparatus 100 to acquire the magnetic resonance data 352 from the imaging zone 108. The alternation of the gradient magnetic field in the data acquisition mode is executed according to a gradient magnetic field alternating scheme defined by the pulse sequences.

In use, each pulse sequence used for acquiring magnetic resonance data may produce a characteristic sound pattern based on its gradient waveforms. The sound generated by the apparatus 100 during data acquisition is mainly due to the gradient coils 110 generating a temporally alternating gradient magnetic field. In order to generate the alternating gradient magnetic field, rapid alternations of currents are caused within the gradient coils 110. These alternating currents, in the presence of the strong main magnetic field, result in significant Lorentz forces that act upon the gradient coils 110. The resulting acoustic sound, referred to herein as "gradient noise", may be manifested as loud tapping, knocking, chirping, squeaking sounds, or other sounds being produced, when the Lorentz forces cause a motion or vibration of the gradient coils 110 as they impact against their mountings which, in turn, flex and vibrate. These vibrations may be radiated into the air as sound waves or transmitted by physical linages to other parts of the apparatus 100.

Gradient noise may be a significant source of patient discomfort. In case the patient feels uncomfortable and is restless or even flinches due to unexpected noise, there is a high likelihood of undesired movements, which in turn cause motion artifacts. Image degradation of magnetic resonance images due to patient motion during the data acquisition is one of the most persistent problems in the clinical application of magnetic resonance imaging. The associated motion artifacts may e.g. appear as ghosting or blurring in the images and often reduce image quality to a degree that makes medical analysis impossible.

Prior solutions to the problem of patient motion involve detecting patient motion and choosing not to acquire or to discard the fraction of MRI data that may contain artifacts, or seeking to minimize patient motion by convenient positioning, immobilization, or patient coaching.

The present disclosure is based on the recognition that the gradient noise can be leveraged by modulating it to deliver to the patient an audible signal designed to induce a non-waking state in the patient. Increased patient throughput is one of the most important drivers in big iron medical imaging, and even a modest increase in the proportion of patients who fall asleep and can be imaged faster will have a cost impact in clinical applications.

Figure 2:
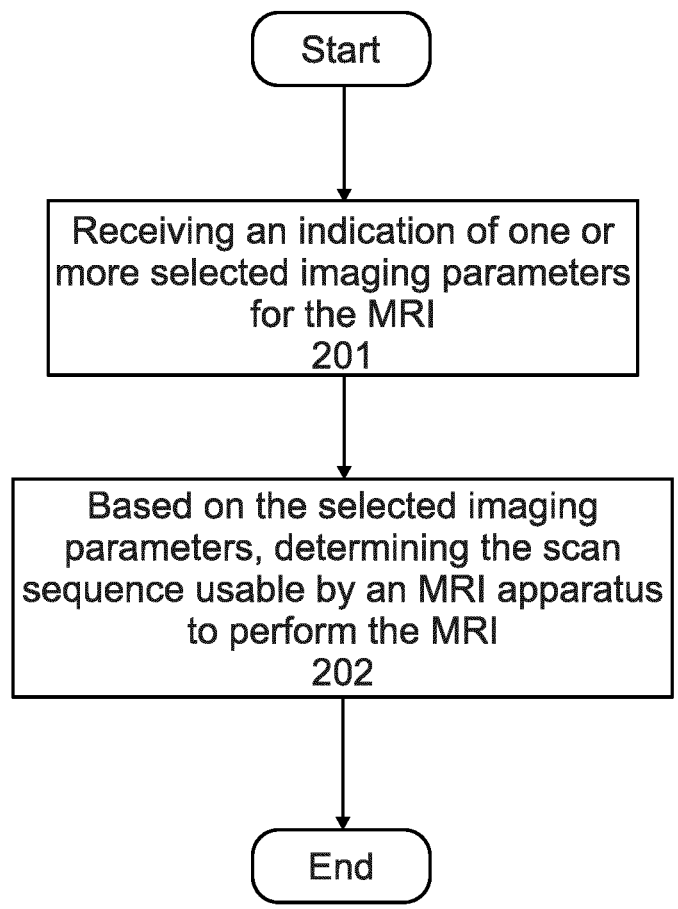
FIG. 2 represents a method of determining a scan sequence for use by the magnetic resonance imaging apparatus of FIG. 1.

Referring now to FIG. 2, there is illustrated a method 200 of determining the scan sequence 350 for the magnetic resonance imaging. The method comprises, at step 201, receiving an indication of one or more selected imaging parameters for the magnetic resonance imaging. At step 202, the method comprises, based on the selected imaging parameters, determining the scan sequence 350 usable by the magnetic resonance imaging apparatus 100 to perform the magnetic resonance imaging. In one example, the operator may select the desired imaging parameters for the MRI scan. For example, the operator may select imaging parameters comprising one or more of image location, slice orientation, image quality, viewpoint, and other parameters. Based thereon, pulse sequences for the gradient coils are determined which control the gradient magnetic field in the imaging zone 108 during the data acquisition.

According to the present disclosure, determining 202 the scan sequence 350 comprises configuring the scan sequence 350 to modulate gradient noise arising from the magnetic resonance imaging apparatus 100 during the magnetic resonance imaging to deliver a first audible signal to the patient, the audible signal being designed to induce a non-waking state in the patient.

By "non-waking state" is meant in particular a sleep state or a hypnotic state, as opposed to a waking state (being awake). Nonetheless, "non-waking state" as used herein may refer to any state of sleep, hypnosis, slumber, passivity, empty-mindedness, or unconsciousness. By "state" may be meant a binary indication of whether the patient is asleep or hypnotized as opposed to awake or a state selected from a set comprising more than two states which additionally indicate the depth or phase of wakefulness, such as awake, REM-sleep, non-REM sleep, hypnotized, for example. "State" may also be understood as a patient measurement or a vector of patient measurements providing sufficient information to determine whether the patient is asleep, hypnotized, or awake, and so on.

In one example, the first audible signal is configured to perform auditory stimulation of slow wave activity in the patient to induce a state of sleep in the patient. Auditory stimulation can be used to enhance sleep by enhancement of slow wave activity of the brain. Specifically, repeated auditory stimulation in the slow wave band (0.5-4 Hz) has been shown to enhance such waves. Sleep slow waves are high amplitude EEG waves (>50 microvolt) that occur about once per second during deep, non-rapid eye movement sleep. Slow waves are the best known marker of the homeostatic regulation of sleep. It is proposed herein to use modify sequences such that the gradient noise is modulated to perform such auditory stimulation of slow waves. Any suitable form of auditory slow-wave stimulation capable of being reproduced by the MRI apparatus 100 may be chosen for the modulation. The stimulation may comprise a periodic stimulation with a rising and a falling sound intensity and with a frequency in the desired range. Suitable forms of auditory stimulation for inducing slow wave activity are described for example in TONONI G, et al Enhancing sleep slow waves with natural stimuli. Medicamundi 2010:54(2); 82-88.

Additionally or alternatively, the first audible signal may comprise a predetermined hypnotic suggestion using which the patient may be trained to enter or return to a state of hypnosis. The predetermined hypnotic suggestion may comprise a pattern of noises. In this case, configuring the scan sequence 350 comprises modulating the gradient noise to output the pattern of noises. In contrast to the slow wave stimulation, the hypnotic suggestion may comprise an impulse. In one example, the hypnotic suggestion comprises a clicking noise, resembling for example the hypnotherapist clicking their fingers. The clicking noise may readily be created by means of a relatively high acoustic frequency, non-repetitive, short-duration sound, followed a fraction of a second later by a tapping sound resembling the clicked finger as it hits the hand and stops. "Relatively high" means for example that the frequency of the sound is higher than an average frequency of the gradient by some predetermined margin.

The gradient noise may be modulated in any appropriate manner to deliver the audible signal. In a first modulation example, configuring the scan sequence 350 comprises determining an expected relative sound level of the gradient noise for each of a plurality of portions of the scan sequence 350, with the portions in the scan sequence being ordered to achieve a modulation of the gradient noise via the sound level that is suitable for delivering the first audible signal. The portions may make up some or all of the scan sequence. Some portions may be associated with a sound level that is higher than that of other portions, with the varying sound level thus defining a modulation to the gradient noise. The expected relative sound level of the gradient noise for a said portion may be determined based at least on a gradient waveform of the said portion, for example. The ordering may comprise reordering elements of an existing sequences. The sound level of the sequence can be modelled based on the hardware configuration of the apparatus 100 and the gradient waveform of the sequence. Each sequence consists of louder parts with stronger gradient pulses and less loud parts. Conventionally, these parts are played out in linear or random order. It is proposed herein to reorder these parts to achieve a modulation that is suitable for auditory stimulation of slow waves.

Additionally or alternatively to the first modulation example, a second modulation example comprises configuring the scan sequence 350 by adjusting the timing of gradient pulses to adapt gradient noise, in particular by adjusting the slew rate to adapt the gradient noise, and more particularly by adjusting a maximum allowed slew rate. Commercial MR scanners may offer the option to set the maximally allowed gradient amplitude and slew rate, the latter defined as the rate at which the gradient amplitude changes. In particular the slew rate determines the loudness of an imaging sequence. Effectively, this allows any type of imaging sequence to be run in either in a full speed mode with highest slew rates, which is the loudest variant, or in a silent mode using a reduced slew rate of gradients. It is proposed to use this feature to realize a continuous and repeated change of the maximally allowed slew rate, effectively modulating the gradient noise in this repeated pattern. This pattern is chosen suitably to stimulate the brain, in the above described manner.

Additionally or alternatively to the first two modulation examples, a third modulation comprises configuring the scan sequence 350 by adding one or more gradient pulses to the scan sequence 350 which contribute to the delivery of the first audible signal but which do not modify the image acquisition. As mentioned above, the scan sequence 350 comprises a plurality of gradient pulses configured to cause the MRI apparatus 100 to perform image acquisition according to the selected imaging parameters. Various methods for adding gradient pulses without modifying the image acquisition may be applied. For example, adding the one or more gradient pulses may comprise adding a plurality of bipolar pulses with net zero-integral. Such bipolar pulses may be added at times when neither RF pulses are played out, nor at times when the MR signal is sampled. Typical imaging sequences may offer a wide range of possibilities to integrate such pulses without any effect on the image, e.g. in the time period between sampling of some data and the next RF excitation of new magnetization.

In addition to inducing the non-waking state, the scan sequence 350 may be further configured to modulate the gradient noise to output one or more noises designed to awaken the patient from the non-waking state, for example at or towards either the end of the MRI scan or the end of a motion-sensitive portion of the scan. Such a noise could be a highly discordant noise, or alternatively a second acoustic impulse type of hypnotic suggestion (such as a short whistling noise), but in this case with the suggestion to wake up.

In the above example, the scan sequence 350 is determined by the processor 130 of the MRI apparatus 100 and stored in the data storage 134, to be obtained when needed by retrieval from the data storage 134. In another example, the scan sequence 350 is obtained via its direct determination and use by the processor 130 without storage and retrieval. In other examples, the scan sequence 350 is determined by a remote computing device, and transmitted to, or input to, the MRI apparatus 100 for storage or direct use.

In addition to the first audible signal described above, it is further envisaged that the MRI apparatus 100 may output a second audible signal designed to induce a non-waking state in the patient. In this regard, the magnetic resonance imaging apparatus 100 optionally further comprises at least one audio output element 122 comprising, for example, one or more loudspeakers, headphones, earpieces, and the like, with the memory 136 further comprising an audio output control module 254 for controlling the audio output element 122 to output the second audible signal. In particular, the second audible signal may comprise one or more of: i) hypnosis induction audio; ii) progressive muscle relaxation audio; iii) guided sleep meditation audio. The second audible signal may be stored in the data storage 134 in the form of an audio file 354 or a text file 354 to be rendered as speech using text-to-speech rendering functionality. Progressive muscle relaxation is a deep muscle relaxation technique which is applied for tension control in therapeutic or prophylactic purposes. Most notably it has been applied successful in the non-pharmacological treatment of insomnia patients. However, also in subjects without this type of pathology, progressive muscle relaxation can be used to guide the patient to fall asleep or at least to arrive at a deeply relaxed physical state. Both conditions will reduce patient motion during the MRI scan. Sleep meditation is another known method to induce sleep to an individual. Typically the individual needs to prior training to use mediation to facilitate falling asleep. However, with a guided instruction system, as described below, also untrained individuals can be aided to fall asleep by guidance through the typical steps of a sleep meditation procedure.

It is further envisaged that one or more parameters of the first and/or second audible signal may be adapted based on one or more detected physiological or psychological conditions indicative of the state of the patient. To this end, the magnetic resonance imaging apparatus 100 optionally further comprises a psychophysiological measurement system 102. The psychophysiological measurement system 102 is configured to measure in real time one or more signals from the patient which are indicative of the state of the patient, in particular whether the patient is in the non-waking state or in the waking state. To this end, the psychophysiological measurement system 102 may comprise one or more cameras (e.g. for closed eye detection, breathing rate detection, motion detection), electroencephalography (EEG) electrodes, breathing rate sensors, galvanic skin response (GSR) sensors, heart rate sensors, electromyography (EMG) sensors, and the like. The measured signals are stored in the data storage 134 as sensor data 356. An interpretation module 256 in the memory 136 contains computer-executable code which enables the processor 130 to relate the signals measured by the psychophysiological measurement system 102 to the patient state. Suitable techniques for assessment of sleep states ("sleep staging") will be known to the person skilled in the art.

In the case of the first audible signal produced by modulating the gradient noise, modulations may be adapted to the gradient noise based on detected patient state for example by changing the amplitude and the frequency of the slow wave modulation induced by the MRI apparatus 100. More complicated patterns may also be played out, for example the impulse patterns described above for hypnotic suggestion. The scan control module 250 may comprise instructions for adapting parameters of the first audible signal to the detected one or more physiological or psychological conditions indicative of the state of the patient.

Similarly, for the second audible signal, where this comprises spoken text, the parameters to be adapted may comprise one or more of: tempo of the spoken text; tone of the spoken text; a voice used for speech synthesis or narration; segments of spoken text to be added, removed, repeated, or reordered. The audio output control module 254 may comprise instructions for adapting the parameters of the second audible signal to the detected one or more physiological or psychological conditions indicative of the state of the patient.

Figure 3:
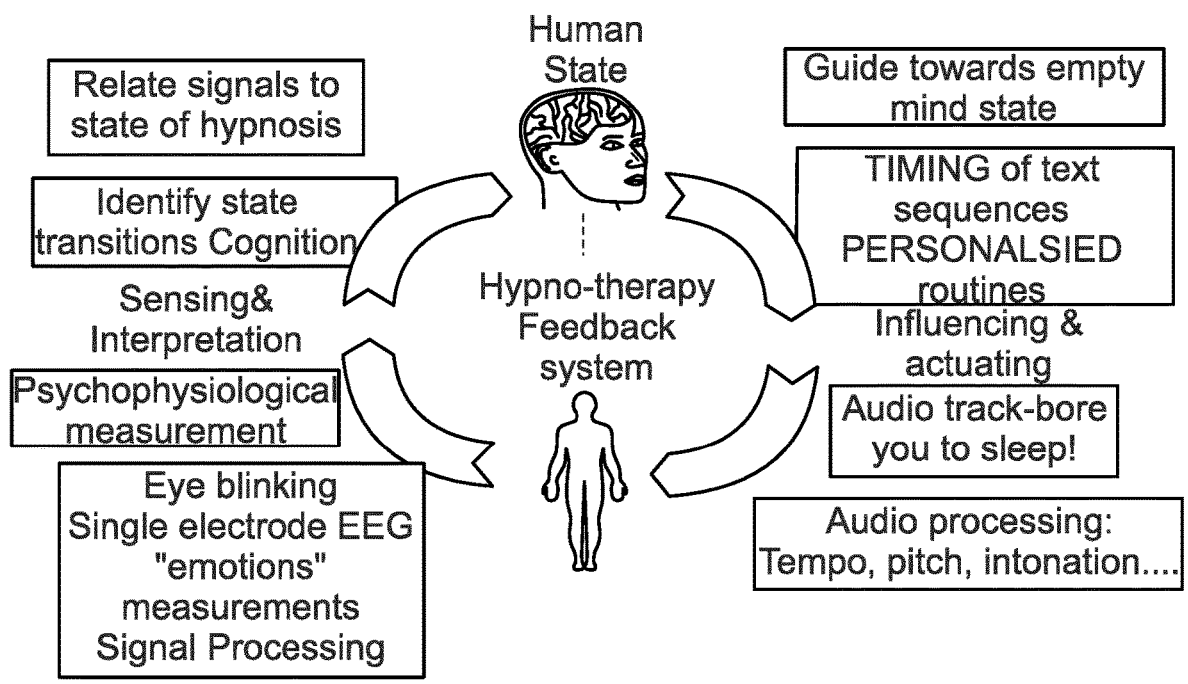
FIG. 3 illustrates a feedback loop for inducing hypnosis using an adaptive speech-modified soundtrack.

FIG. 3 illustrates one example of a feedback loop for inducing hypnosis using an adaptive speech-modified soundtrack. In this example, the audio output control module 254 comprises text-to-speech rendering functionality for use prior to or during the scan. The rendering of the speech is adapted so as to be made unnatural, for example by slowing down and reducing the tonal range of the speech. The speech rendering strategy is such that the speech is adapted to the mental state of the patient, which may be determined as described above. The following example is directed at guiding the patient into an empty minded state, as is the case during a hypnotherapy session. The text may take the subject through the following phases:

1. Preparation

The first phase may involve having the subject sit or lie down and getting comfortable. In this case the subject could be invited to lie down on the scanner bed during the scan preparation phase.

2. Induction

Induction takes the subject from normal awareness to a state of enhanced relaxation. At this point the subject may be asked to focus on a point in the corner of their peripheral vision—hence inducing eye strain and in combination with the speech rendering described below causing the subjects eyes to close.

3. Deepening

The deepening phase takes the subject from a relaxed state into a hypnotic state, where conscious thinking is minimized.

4. Purpose

There may be many purposes for a hypnosis, such as a therapeutic session. However, here the purpose is simply to maintain a relaxed state during the scan. This purpose will be provided at this phase.

5. Awakening

The awakening phase is when the subject is taken out of the hypnotic state. Using another standard block of text or a specific sound or sound sequence (such as a clicking of fingers) the subject is brought back to a state of awareness with the conscious mind fully reengaged.

The audio output control module 254 may execute an adaptive speech rendering algorithm, or a guiding algorithm, which, based upon the measured state of hypnosis and the phase of the hypnosis session (i.e. induction, deepening etc.) selects portions of the text from the narrative to be rendered, and determines the timing and rendering of the text. The adaptive speech rendering algorithm can be beneficially used in all phases of the hypnotherapy routine, but will be of particular use during the induction and deepening phases in adjusting the tempo, pitch and intonation of the voice in order to guide the subject into a hypnotic state.

Regarding timing of the text, depending upon the speed at which the subject becomes hypnotized, the algorithm may:
  repeat fragments of the text from the narrative several times if the subject becomes hypnotized more slowly than average;
  skip fragments of the text (or entire blocks of text) from the narrative if the subject becomes hypnotized more quickly than average.

Regarding rendering, as the subject moves through the phases of hypnosis, the algorithm may:
  continuously change the tempo of the speech. In general, the tempo gets slower the closer the subject is to reaching a state of hypnosis (i.e. towards the end of the deepening phase). Once the subject is hypnotized the tempo returns to a more normal tempo.
  slow down the tempo of the text towards the end of a sentence or phrase. The rate at which voice slows down also depends upon how fast the subject becomes hypnotized.
  continuously change the tone of the speech. In general, the tone gets more monotonous (by e.g. lowering the pitch, removing dynamics of amplitude, reducing the frequency range towards a constant frequency) the closer the subject is to reaching a state of hypnosis (i.e. towards the end of the deepening phase). Once the subject is hypnotized the tone returns to a more normal tone.
  make the tone of the spoken text more monotonous towards the end of a sentence or phrase. The rate at which the spoken text becomes more monotonous also depends upon how fast the subject becomes hypnotized.
  for subjects who have difficulty becoming hypnotized, implement a further speech rendering form in which the speech takes on a more dominant character. In all cases however, the basic narrative remains identical.
  keep the personalization natural—particularly the part in which the user speaks in themselves must be delivered with the same tone as the rest which can be achieved using known audio processing techniques.
  change from a male to a female voice or vice versa.

The adaptive speech rendering algorithm may thus include any one or more of the following functions:
- changing the tempo of the spoken text without altering the tone of the text;
- slowing down the spoken text in a monotonic manner without altering the tone of the text;
- altering the tone (pitch, dynamics, frequency ranges etc.) of the spoken text without altering the tempo;
- altering the tone of the spoken text in a monotonic manner without altering the tempo of the text;
- altering both tone and tempo in a connected manner—for example both slowing down the spoken text and lowering pitch and maybe also the amplitude in phase with one another;
- for repeated or successive spoken text fragments, ensuring that the rendering at the start of the following fragment matches that of end of the proceeding fragment;
- adapting the spoken text to apparently be spoken by another person;
- incorporating new spoken text, as generated by the user or provided via a software file (e.g. from a hypnotherapist) naturally into an otherwise standard spoken text.

A series of audio fragments may be created which can be:
- manipulated in their audio content in any of the manners described above;
- rendered in a specific order dependent upon the measured state of hypnosis and the phase of the hypnosis process—the order being determined as described above.

The patient may undergo phases 1-4 in the hypnosis process even prior to entering the scanner. Such a process usually takes a period of around 2-10 minutes dependent upon the subject.

The hypnosis with a purpose (suggestion) to remain relaxed in the scanner will generally result in a period of around 20-30 minutes of hypnosis. If such a period is insufficient to complete a scan, a secondary hypnosis can be initiated. This is possible by introducing a short-cut suggestion during the purpose phase—such as a single impulse (like a clicking sound) or phrase which can be rendered by the device—which can immediately return the patient to the state of hypnosis. In specific situations this short-cut suggestion may be a series of noises produced by the MRI apparatus 100 itself, in the manner described above. At the end of the session, or indeed if there are any reasons to interrupt the session, the patient can be awakened as described in phase 5. Here, again in specific situations. this awakening suggestion may be a series of noises produced by the apparatus 100 itself (for example to simulate a short sound pulse like produced by the clicking of the fingers or a whistling sound etc.).

Although the example in FIG. 3 has been described with reference to a hypnosis narrative, it will be appreciated that the text may additionally or alternatively relate to a progressive muscle relaxation or a guided sleep meditation, as mentioned above.

The method of controlling the apparatus 100 may further comprise controlling one or more actuable elements positioned for contact with the patient to deliver sleep-inducing acupressure to the patient. Inducing sleep may only work with a method accepted by the patient. A comfortable method of relaxation and inducing/stimulating sleep is acupressure. Acupressure is a low-risk approach that is safe for most patients. In an autonomous imaging setup, it is proposed herein to control and apply actuators located at distinct acupressure points of the patient to induce sleep. Acupressure relies on massage and firm touch of local points. The An Mian points are on either side of the neck and the Yin Tang point is in the center of the eyebrows, just above the nose. Applying pressure to these points may help relieve insomnia. The massage acupressure actuators can be located in the MRI head coil or located in the head rest located under the neck. Alternatively the devices may be located in the support 120 or can be applied as standalone and wireless devices (armband, bracelet, and lower leg, wrist, fixed to coils). The actuators are controlled via a state machine implemented e.g. by a corresponding module in the memory 136 in combination with the other techniques to induce sleep as proposed herein. The selection and combination of the different techniques proposed herein may also be controlled via the state machine. The selection, combination and control of different techniques depends on the physical and emotional state of the individual patient, the kind and duration of the clinical imaging or therapy procedure.

The method of controlling the apparatus 100 may further comprise controlling a movable patient table of the MRI apparatus 100, e.g. the support 120, to effect a sleep-inducing rocking motion. In running cars or trains, passengers often feel sleepy due to low frequency rocking effect. Lots of studies suggest that low-frequency vibration induces sleep. By reproducing this phenomenon using the support 120, it is feasible to put the patient to sleep without any harmful effects. Since many of the big iron healthcare devices have a support 120 with 2-6 degree of freedom, it is proposed to use the motion of the support 120 (which may be described using an algorithm) to bring about a sleep-inducing effect. Similarly, a counter pattern of motion for inducing awakening can also be implemented for those scans where patient cooperation/support is required. Both the motion pattern generation and the control of the support 120 can be linked with the scan sequence/protocol so that the in-between scan duration can be used for sleep-inducing or sleep-dissuading vibration patterns.

The method of controlling the apparatus 100 may further comprising controlling a haptic element to deliver sleep-inducing haptic output to the patient. The apparatus 100 may thus comprise a touchless haptic system which can be used to deliver a patient sleep pattern. It is known that comforting touch reduces stress/anxiety and helps calm down a person and can even made them sleep. The haptic system (such as an ultrasound based haptic system) may thus be used to provide a sensation of touch to de-stress the patient for easy sleep. For patients who have elevated stress or who are unable to sleep or need assistance for sleep, the touchless haptic system can be integrated with the big iron modality. This touchless haptic system may provide a specific pattern of haptic touch for comfort and sleep induction.

Wearable health devices such as Healthwatch provide rich data concerning patient sleeping habits. Many of these devices have the ability to capture environmental factors such as noise, music playing (by app monitoring or song fingerprinting using microphone), light conditions (using a light sensor), movements (accelerometer) etc. Based on this data, specific sleep environment and patterns can be identified and replicated in the apparatus 100. This is particularly suitable for situations in which the scanner is situated in a room with ambient lighting and other multimedia facilities.

In summary, described here are systems and methods to induce sleep in a patient prior to or during an imaging scan, which can work in a (semi) autonomous setting where only limited staff are present. The systems and methods may induce a state of sleep prior to or during a scan using the following approaches:

automatic induction of a hypnotic state;
use of acoustic signals to enhance the sleep state;
progressive muscle relaxation;
sleep meditation;
induction/Stimulation using acupressure;
sleep inducing motion (from a patient table).

The subject-matter described herein may be applied to all scanning modalities (MRI, CT, PET, and so on) which generate modulable noise, in which the patient may for example be scanned in a supine position, and is particularly suited for an autonomous setting.

Aspects of the present invention may take the form of an entirely hardware embodiment, an entirely software embodiment (including firmware, resident software, micro-code, etc.) or an embodiment combining software and hardware aspects that may all generally be referred to herein as a "module" or "system". Furthermore, aspects of the present invention may take the form of a computer program product embodied in one or more computer readable medium(s) having computer executable code embodied thereon. Any combination of one or more computer readable medium(s) may be utilized. The computer readable medium may be a computer readable signal medium or a computer readable storage medium. A "computer-readable storage medium" as used herein encompasses any tangible storage medium which may store instructions which are executable by a processor of a computing device. The computer-readable storage medium may be referred to as a non-transitory computer-readable storage medium. "Computer memory" or "memory" is an example of a computer-readable storage medium. Computer memory is any memory which is directly accessible to a processor. "Computer storage" or "storage" is a further example of a computer-readable storage medium. Computer storage is any non-volatile computer-readable storage medium. In some embodiments computer storage may also be computer memory or vice versa. A "processor" as used herein encompasses an electronic component which is able to execute a program or machine executable instruction or computer executable code. References to the computing device comprising "a processor" should be interpreted as possibly containing more than one processor or processing core.

While the invention has been illustrated and described in detail in the drawings and foregoing description, such illustration and description are to be considered illustrative or exemplary and not restrictive. The invention is not limited to the disclosed embodiments. Other variations to the disclosed embodiments can be understood and effected by those skilled in the art in practicing the claimed invention, from a study of the drawings, the disclosure, and the appended claims.

In the claims, the word "comprising" does not exclude other elements or steps, and the indefinite article "a" or "an" does not exclude a plurality. A single processor or other unit may fulfill the functions of several items recited in the claims. The mere fact that certain measures are recited in mutually different dependent claims does not indicate that a combination of these measured cannot be used to advantage. A computer program may be stored/distributed on a suitable medium, such as an optical storage medium or a solid-state medium supplied together with or as part of other hardware, but may also be distributed in other forms, such as via the Internet or other wired or wireless telecommunication systems. Any reference signs in the claims should not be construed as limiting the scope.

The invention claimed is:

1. A method of determining a scan sequence for magnetic resonance imaging (MRI), the method comprising:
    receiving an indication of one or more selected imaging parameters for the MRI; and
    based on the selected imaging parameters, determining the scan sequence usable by an MRI apparatus to perform the MRI,
    wherein determining the scan sequence comprises configuring the scan sequence to modulate gradient noise arising from the MRI apparatus during the MRI to deliver a first audible signal to the patient, wherein the first audible signal is configured to perform auditory stimulation of slow wave activity in the patient to enhance a state of sleep in the patient.

2. The method of claim 1, wherein the auditory stimulation comprises a periodic rising and falling of the sound level of the gradient noise with a frequency in the slow wave band (0.5-4 Hz).

3. The method of claim 1, wherein configuring the scan sequence comprises determining an expected relative sound level of the gradient noise for each of a plurality of portions of the scan sequence, and ordering the portions in the scan sequence to achieve a modulation of the gradient noise via the sound level that is suitable for delivering the first audible signal.

4. The method of claim 3, wherein some of the said portions are associated with a sound level that is higher than that of other said portions, and wherein the varying sound level defines the modulation to the gradient noise.

5. The method of claim 3, wherein determining the expected relative sound level of the gradient noise is based at least on gradient waveforms of the said portions.

6. The method of claim 3, wherein the ordering comprises reordering elements of an existing sequence.

7. The method of claim 1, wherein configuring the scan sequence comprises adjusting the timing of gradient pulses by implementing a continuous and repeated change of a maximally allowed slew rate to modulate the gradient noise in a repeated pattern.

8. The method of claim 1, wherein the scan sequence comprises a plurality of gradient pulses configured to cause the MRI apparatus to perform image acquisition according to the selected imaging parameters, and wherein configuring the scan sequence comprises adding one or more gradient pulses to the scan sequence which contribute to the delivery of the first audible signal but which do not modify the image acquisition.

9. The method of claim 8, wherein the adding the one or more gradient pulses comprises adding a plurality of bipolar pulses with net zero-integral.

10. The method of claim 8, comprising adding the pulses at times when no RF pulses are and being emitted and when an MR signal is not being sampled.

11. The method of claim 1, wherein configuring the scan sequence further comprises modulating the gradient noise to output one or more noises designed to awaken the patient from the non-waking state.

12. A method of controlling a magnetic resonance imaging (MRI) apparatus, the method comprising:
    obtaining a scan sequence determined according to claim 1; and
    controlling the MRI apparatus to perform an MRI scan using the obtained scan sequence.

13. The method of claim 12, further comprising detecting one or more physiological or psychological conditions indicative of the state of the patient, and adapting one or more parameters of the first audible signal to the detected one or more conditions.

14. A computing device or an MRI apparatus comprising a processor configured to perform the method of claim 1.

15. A computer-readable medium comprising instructions stored on a non-transitory computer readable medium which, when executed by a computing device, enable the computing device to carry out the method of claim 1.

* * * * *